United States Patent
Satou et al.

(10) Patent No.: US 7,323,716 B2
(45) Date of Patent: Jan. 29, 2008

(54) MANUFACTURING METHOD OF THIN FILM TRANSISTOR SUBSTRATE

(75) Inventors: Takeshi Satou, Kokubunji (JP); Toshihiko Itoga, Chiba (JP); Takeo Shiba, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 123 days.

(21) Appl. No.: 11/032,026

(22) Filed: Jan. 11, 2005

(65) Prior Publication Data
US 2005/0121673 A1    Jun. 9, 2005

Related U.S. Application Data

(62) Division of application No. 10/424,950, filed on Apr. 29, 2003, now Pat. No. 6,864,134.

(30) Foreign Application Priority Data
May 10, 2002    (JP)    ............... P2002-134885

(51) Int. Cl.
*H01L 29/76*    (2006.01)
*H01L 31/036*    (2006.01)
*H01L 31/112*    (2006.01)
*H01L 29/90*    (2006.01)
*H01L 27/01*    (2006.01)

(52) U.S. Cl. ................ 257/66; 257/262; 257/349; 257/365

(58) Field of Classification Search ............... 257/66, 257/72, 67, 262, 349–351, 365–366
See application file for complete search history.

(56) References Cited

U.S. PATENT DOCUMENTS 5,563,440 A    10/1996    Yamazaki et al. .......... 257/369

6,306,693 B1    10/2001    Ishiguro et al. ............. 438/149

(Continued)

FOREIGN PATENT DOCUMENTS

JP    5-335573    12/1993

(Continued)

OTHER PUBLICATIONS

Asia Display, IDW '01 Proceedings, p. 319-322.

(Continued)

*Primary Examiner*—Chuong Anh Luu
(74) *Attorney, Agent, or Firm*—Mattingly, Stanger, Malur & Brundidge, P.C.

(57) ABSTRACT

This invention provides a manufacturing method for fabricating on the same substrate both high voltage thin film transistors suitable for driving liquid crystal and low voltage drive high performance thin film transistors. In addition, this invention provides a thin film transistor substrate where the area occupied by a storage capacitor in each pixel is reduced to raise the aperture ratio of the display unit.

One aspect of this invention provides a manufacturing method characterized in that the impurity regions of both high voltage thin film transistors and high performance thin film transistors which differ in the thickness of gate insulation are formed by implanting a dopant through the same two-layered film. Another aspect of this invention reduces the area occupied by the drive circuit in the display unit by utilizing an extension of one layer of the insulation film included in each thin film transistor.

4 Claims, 12 Drawing Sheets

U.S. PATENT DOCUMENTS

| | | |
|---|---|---|
| 6,362,030 B1 | 3/2002 | Nagayama et al. .......... 438/151 |
| 6,462,723 B1 | 10/2002 | Yamazaki et al. ............. 345/82 |
| 6,506,642 B1 | 1/2003 | Luning et al. ............... 438/231 |
| 6,528,852 B2 | 3/2003 | Takemura .................... 257/350 |
| 6,635,505 B2 | 10/2003 | Tanaka et al. ................. 257/72 |
| 6,646,288 B2 | 11/2003 | Yamazaki et al. .............. 257/72 |
| 6,706,544 B2 * | 3/2004 | Yamazaki et al. .............. 438/30 |
| 6,781,646 B2 | 8/2004 | Kawachi et al. ............... 349/47 |
| 2002/0179908 A1 * | 12/2002 | Arao ........................... 257/72 |
| 2003/0124778 A1 | 7/2003 | Doi et al. .................... 438/151 |
| 2003/0151049 A1 | 8/2003 | Hotta et al. ................. 257/151 |
| 2003/0170938 A1 | 9/2003 | Takahashi ................... 438/166 |

FOREIGN PATENT DOCUMENTS

| | | |
|---|---|---|
| JP | 11-163366 | 6/1999 |

OTHER PUBLICATIONS

Asia Display, IDW '01 Proceedings, p. 323-326.
Asia Display, IDW '01 Proceedings, p. 319-322, date is unknown.
Asia Display, IDW '01 Proceedings, p. 323-326, date is unknown.

* cited by examiner

MANUFACTURING METHOD OF THIN FILM TRANSISTOR SUBSTRATE

This application is a Divisional of 10/424,950 filed on 04/29/2003, now U.S. Patent No. 6,864,134

BACKGROUND OF THE INVENTION

1. Field of the Invention

The present invention relates to a polycrystalline Si (silicon)-used thin film transistor substrate applicable to a driver-integrated type display unit and a method for manufacturing thereof.

The present invention is effectively applicable to thin film transistor substrates, and particularly, low temperature polycrystalline Si technology-used thin film transistor substrates, used in driver-integrated type liquid crystal display units and organic electroluminescence display units.

2. Related Arts

Aimed at higher definition and lower cost liquid crystal display units, a thin film transistor (hereinafter abbreviated as TFT)-used driver is formed on a substrate. These TFTs are fabricated from a polycrystalline Si film formed at low temperatures (hereinafter denoted simply as a low temperature polycrystalline Si film). In the case of mobile information terminals, it is especially needed to reduce the occupation area and power consumption of their driver.

Directed to these and other needs, many techniques have been proposed. They are largely classified into two categories. One is to fabricate on the same substrate both high voltage thin film transistors needed to drive liquid crystal and high performance thin film transistors for the driver while the other is to use a low temperature polycrystalline Si film to fabricate thin film transistors constituting the electronic circuit of the display unit. A method for fabricating on the same substrate both high voltage thin film transistors needed to drive liquid crystal and high performance thin film transistors for the driver is disclosed in, for example, Japanese Patent Laid-open No. 5-335573. In the case of N-type thin film transistors, a lightly doped drain (LDD) region is formed at the end of the gate in order to raise the withstand voltage and reduce the off current. For example, in Japanese Patent Laid-open No. 11-163366, a method is disclosed which forms a LDD region at the end of the gate in a self-aligned manner without misalignment. Meanwhile, a display unit in which organic electroluminescence elements are driven by thin film transistors made from a low temperature polycrystalline Si film was disclosed at ASIA DISPLAY/IDW'01, Proceedings, p. 319.

Prior art TFTs, with which the present invention is concerned, involves the following drawback. Since a plurality of transistor regions is formed, a dopant must be implanted into the semiconductor film through gate insulation films which have different thicknesses. In this process, the dopant implanted depth varies depending on the thickness of the gate insulation film as a matter of course. Accordingly, to form impurity regions which require different implantation depths, implantation must be done in several stages while changing the acceleration voltage, resulting in an increased number of production steps. Meanwhile, implanting a dopant into the semiconductor film before forming a gate insulation film is likely to cause misalignment between the gate and doped regions although the number of production steps can be suppressed. Therefore, this method adds an increased parasitic capacitance to the transistor.

In addition, forming both high voltage thin film transistors with LDDs and high performance thin film transistors with no LDDs on the same substrate requires another mask to selectively form LDD regions, resulting in increased production steps.

With this situation behind, it is a first object of the present invention to provide a simple manufacturing method for forming on the same substrate both high voltage thin film transistors with LDDs, suitable for driving liquid crystal or the like, and high performance thin film transistors capable of low voltage driving.

If a polycrystalline Si film is used to form thin film transistors in a driver-integrated type display unit, each pixel must have a large capacitance to retain the image signal since the off current of TFT is large. Disadvantageously, this makes it impossible to raise the aperture ratio. It is another object of the present invention to provide a high aperture ratio and low power consumption display unit of this type by reducing the area of capacitance. To achieve this object, the present invention provides a thin film transistor substrate having a higher aperture ratio than conventional ones.

SUMMARY OF THE INVENTION

A first aspect of the present invention is to form the impurity regions of both high voltage thin film transistors and high performance thin film transistors whose gate insulation films are different in thickness from each other by implanting a dopant through the same two-layered insulation film. A second aspect of the present invention is to utilize an extension of one layer of the insulation film included in each thin film transistor in order to reduce the area occupied by the driver in the display unit.

A scheme of the present invention is outlined below. A first thin film transistor comprises a crystalline semiconductor layer, a first gate insulation film and a first gate layer deposited sequentially on a substrate. Likewise, a second thin film transistor comprises the crystalline semiconductor layer, the first gate insulation film, a second gate insulation film and a second gate layer but does not have the first gate layer. A dopant is implanted into the semiconductor films of both first and second thin film transistors through the first and second gate insulation films by utilizing a resist pattern used to process the second gate layer and the patterned first gate layer both as a mask.

Another scheme of the present invention is outlined below. The second gate layer is processed in such a manner that the patterned gate layer is recessed from the resist pattern. By utilizing the resist pattern used to process the second gate layer and the patterned first gate layer both as a mask, a N-type dopant is implanted into the semiconductor film. After removing the resist pattern, the N-type dopant is implanted at a lower dose than in the previous step into the semiconductor film through the first and second gate insulation films by utilizing the patterned first and second gate layers both as a mask.

Major implementations of the present invention are described as follows:

A first implementation of the present invention is a method for manufacturing a substrate on which thin film transistors are fabricated, characterized in that the method comprises the steps of (1) forming a plurality of crystalline semiconductor regions on a substrate, (2) forming a first insulation film which covers the plurality of crystalline semiconductor regions, (3) forming a first gate electrode as a first gate layer at a desired position of the first insulation film, (4) forming a second insulation film above the substrate, (5) forming a second gate layer as a conductive film serving as a second gate electrode at a desired position of the second insulation film, (6) into each of said crystalline semiconductor regions on which a N-type transistor is to be formed, implanting a N-type impurity through at least the first insulation film and second insulation film to form a first and second impurity regions of the N-type transistor, and (7) into each of said crystalline semiconductor regions on which a P-type transistor is to be formed, implanting a P-type impurity through at least the first insulation film and second insulation film to form a first and second impurity regions of the P-type transistor.

A second implementation of the present invention is a method for manufacturing a thin film transistor substrate, characterized in that the method comprises the steps (1) forming a plurality of crystalline semiconductor regions on a substrate, (2) forming a first insulation film which covers the plurality of crystalline semiconductor regions, (3) forming a conducive layer on the first insulation film as a first gate layer and, from the first gate layer, forming a first gate electrode of a N-type transistor and a first gate electrode of a P-type transistor in desired positions, (4) forming a second insulation film above the substrate, (5) forming a second conductive layer serving as a second gate electrode at a desired position of the second insulation film, (6) processing a desired area of the second gate layer into at least a second gate electrode of a N-type transistor, (7) into the crystalline semiconductor region constituting the N-type transistor for which the second gate electrode is formed, forming a first and second impurity regions of the N-type transistor by implanting a N-type impurity through at least the first insulation film and second insulation film while a region larger than the second gate region is masked, (8) processing a desired area of the second gate layer into at least a second gate electrode of a P-type transistor and (9) in the crystalline semiconductor region corresponding to the P-type transistor for which the second gate electrode is formed, forming a first and second impurity regions of the P-type transistor by implanting a P-type impurity through at least the first insulation film and second insulation film, wherein a first N-type thin film transistor comprising a first electrode in the first gate layer and a gate insulation film consisting of the first insulation film, a first P-type thin film transistor comprising a first gate electrode in the first gate layer and an insulation film consisting of the first insulation film, a second N-type thin film transistor comprising a second gate electrode in the second gate layer and a two-layered insulation film consisting of the first insulation film and the second insulation film, a second P-type thin film transistor comprising a second gate electrode in the second gate layer and a two-layered insulation film consisting of the first insulation film and second insulation film are formed.

Preferably, the step of forming the first and second impurity regions, shown above, can be done by the following method.

This steps further includes the steps of: into the crystalline semiconductor region constituting the N-type transistor, implanting a N-type impurity at a first dose through at least the first insulation film and second insulation film while a region larger than the corresponding first gate region and second gate region is masked; and into the crystalline semiconductor region constituting the N-type transistor, implanting the N-type impurity at a second dose lower than the first dose through at least the first insulation film and second insulation film while the first and second gate electrodes are used as a mask.

To ensure that a region larger than the second gate electrode is masked, it is practical to utilize the photo resist used to process the second gate electrode. In this case, the width of the gate electrode can be made narrower than the width of the photo resist as desired by the so-called side etching.

If the thin film transistor substrate is to be used in display units, it is preferable to employ a transparent insulation sheet as the substrate. The particular examples of display units to which this thin film transistor substrate is applicable are liquid crystal display units and organic electroluminescence display units. Such liquid crystal display units include both reflection type and transparent type display units. In the case of a reflection type display unit, the substrate must not be transparent. In addition, since the present invention allows high voltage drive thin film transistors to be formed together with low voltage drive peripheral circuitry, it can also be applied to electrophoreses displays and electronic particulate displays which require relatively high drive voltage.

In addition, the second gate electrode may consist of a plurality of conductive layers.

To form the first and second impurity regions as desired, it is preferable to make the first insulation film thinner than the first gate layer. Further, for this purpose, it is preferable to make the total thickness of the first and second insulation film smaller than the second gate layer.

Practically, to satisfy the above relationship, it is preferable that the first gate layer is not thinner than 100 nm and the first and second insulation films through which N-type and P-type impurities are implanted are not thicker than 150 nm in total.

In addition, it is practical to taper the sides of the first gate electrode. The insulation layer formed on the first gate electrode is likely to swell at the sides of the gate electrode if the sides are cut perpendicularly, resulting in changed impurity densities below the edges since ions are implanted through the insulation film.

The above mentioned configuration according to the present invention makes it possible to implant a dopant into the sources and drains of plural thin film transistors differing in the thickness of gate insulation by a single implantation step. Selective formation of LDD is also possible without increasing masks.

A thin film transistor substrate used in a typical display unit has the following basic configuration. On an insulating substrate provided mutually intersecting plural first and second wiring lines, at least, a pixel, a capacitor to retain the signal and a pixel switching device must be formed beside each point of intersection of the first and second wiring lines as well as a driver to drive the wiring lines. In this case, if the pixel switching device comprises a first transistor containing the first and second insulation films and a second transistor whose gate insulation film is the first insulation film according to the present invention, it is very advantageous to form the storage capacitor with a second insulation film extended from the gate insulation film. According to the present invention, the capacitor to retain the image signal applied to the pixel electrode is formed by using the insulation film between the first and second gate layers. This configuration can reduce the area occupied in each pixel by the storage capacitor there, resulting in the raised aperture ratio and reduced power consumption of the display unit.

DESCRIPTION OF THE PREFERRED EMBODIMENTS

Figure 1A:
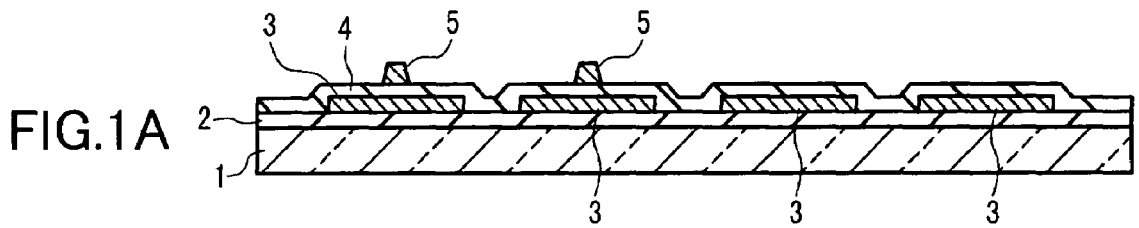
FIGS. 1A to 1E are sectional views, showing an example of a manufacturing flow to fabricate a thin film transistor substrate according to the present invention.

In the order of processing, FIGS. 1A to 1E show an example of a process for manufacturing a thin film transistor substrate according to the present invention. These figures show the changing profile of a major portion as it goes through the respective steps.

On a transparent insulating substrate 1, for example, a glass substrate, a semiconductor film 3 consisting of polycrystalline Si is formed via an undercoat 2 consisting of SiN and SiO2 layers. The undercoat 2 serves to ensure the semiconductor layer is formed properly. This layered. SiN and SiO2 film is formed by, for example, the plasma CVD (Chemical Vapour Deposition) method. Alternatively, the transparent insulating substrate 1 may be a plastic sheet depending on the application.

The polycrystalline Si film is formed by depositing an amorphous Si film by plasma CVD and then annealing the deposited film with a pulsed excimer laser. In the case of excimer laser-used annealing, the thickness of the polycrystalline Si film is preferably 30 to 70 nm, more preferably 40 to 60 nm and still more preferably about 50 nm. If the film is thinner than 30 nm, the film is not sufficiently crystallized. Being thicker than 70 nm is also not appropriate since crystallization requires high intensity laser light, resulting in deteriorated productivity. In addition, such a thick film has larger up and down features after crystallized, which may result in causing the gate coating insulation film to break down. Note that the polycrystalline Si film may also be formed by such another method as depositing an amorphous Si film by means of sputtering and then crystallizing the film with a metallic catalyst or directly depositing polycrystalline Si by means of catalyst-used CVD.

A 50 nm-thick polycrystalline Si film is processed into a desired shape by means of dry etch-included photolithography. This semiconductor film 3 consisting of polycrystalline Si forms transistors, conductive layers, etc. Then, a first gate insulation film 4 consisting of $SiO_2$ is deposited to 50 nm by TEOS (Tetraethoxysilane)-used plasma CVD.

Instead of the above-mentioned CVD method, the first gate insulation film 4 may also be formed by another method, such as oxidizing the Si film with ozone at 450° C. or lower, depositing an oxide film by RF (Radio Frequency) sputtering or a combination of them. On the first gate insulation film 4, a 150 nm-thick first gate layer consisting of MoCr (a molybdenum-chromium alloy containing 2 wt % of chromium) is deposited by sputtering. By means of wet etching with a mixture of phosphoric acid, nitric acid, acetic acid and water, the MoCr layer is etched into a desired shape. This forms gate electrodes 5 each having sides tapered normally at about 60 degrees. The resulting profile of the major portion is shown in FIG. 1A.

Tapering both sides of each first gate electrode 5 in the channel direction of the transistor serves effectively to ensure that ions will be implanted properly into the source and drain impurity regions. This ion implantation will be done via the first gate electrodes 5 and an insulation film 6 formed over the first gate electrodes 5. When the second gate insulation film 6 is formed over the first gate electrode, the second gate insulation film 6 usually swell at positions corresponding to the edges of each gate electrode 5. Variation of the second gate insulation film 6 in thickness varies the impurity density in the impurity regions. In particular, if a gate has high edges, the impurity density in the source and drain would be very low at the ends of the channel. Thus, as in this example, it is practical to at least taper both sides of each first gate electrode 5 in the channel direction of the transistor.

Wet etching is employed to etch the gate layer since wet etching is superior in the control of the $SiO_2$ etching rate relative to the electrode etching rate. This allows gates to be formed without etching the 50 nm or thinner gate insulation film and the undercoat both made of $SiO_2$.

Figure 1B:
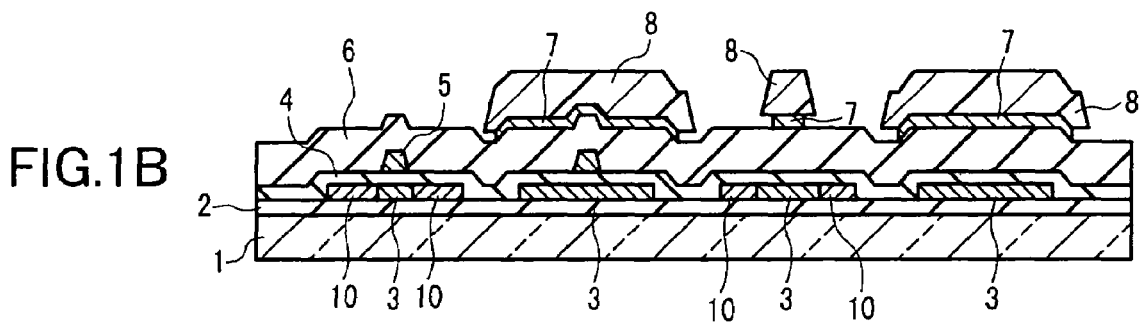

Then, an 80 nm-thick second gate insulation $SiO_2$ film 6 is deposited by means of TEOS-used plasma CVD. On this second gate insulation film, a second gate layer 7 consisting of MoW (a molybdenum-tungsten alloy containing 20 wt % of tungsten) is deposited to a thickness of 150 nm. This layer is coated with a positive resist and the resist layer is processed into a desired resist pattern 8 through exposure and development. By means of wet etching with a mixture of phosphoric acid, nitric acid, acetic acid and water, the second gate layer is etched into such a gate 9 with a desired shape that its width is 1 µm narrower at each side than the width of the resist pattern. Control of the width in the channel direction of the transistor is particularly important P (phosphorous), an N-type impurity, is implanted into the semiconductor film 3 through the second gate insulation film 6 and the first gate insulation film 4. The resist pattern 8 used to process the second gate layer 7 and the gate electrodes 5 made from the first gate layer are used as a mask. With an acceleration voltage of 70 kV, an impurity density of $10^{15}$/ $cm^2$ is obtained. A source and drain 10 are formed in this way. The resulting profile of the major portion is shown in FIG. 1B.

The first gate electrodes 5 must be thick enough to block the implantation of P ions. If this film is a metal film consisting mainly of Mo, the preferable thickness is 100 nm or larger.

Figure 1C:
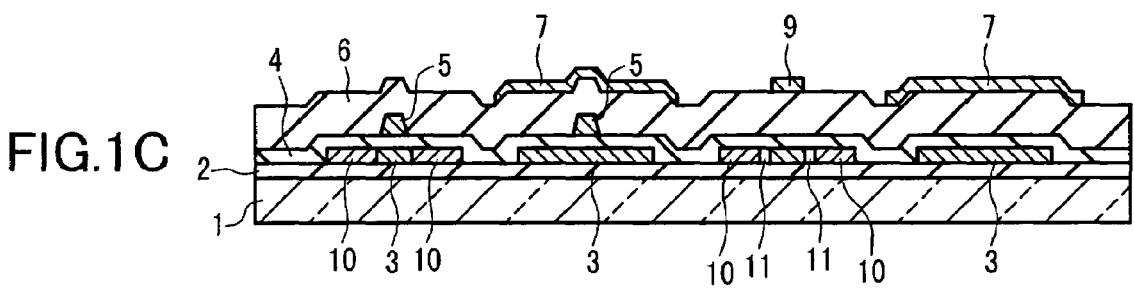

After removing the above-mentioned resist pattern 8, P ions are implanted at a dose of $10^{13}/cm^2$ with an acceleration voltage of 70 kV through the first gate insulation film 4 and second gate insulation film 6. The first gate layer 5 and second gate layer 7 are used as a mask. In each thin film transistor whose gate is made from the second gate layer 7, LDD 11 is formed in a fashion of self-alignment to the gate electrode 9 below the gate's edge area which was previously covered by the resist since P is lightly doped there. The resulting profile of the major portion is shown in FIG. 1C.

In the case of each thin film transistor whose gate electrode is made from the first gate layer 5, no lightly doped area is formed below the edges of the gate since the sides of the gate were tapered. When the first gate layer is processed, if a side is not tapered but cut perpendicularly, the second gate insulation film swells above the edge, resulting in forming a LDD area corresponding to the swelling.

In this embodiment, to form a LDD which is self-aligned to a gate made from the second gate layer, side etching of the gate is done. Alternatively, the same effect may also be obtained by such another method as making the gate pattern narrower by resist ashing or adding a side wall to the gate.

Figure 1D:
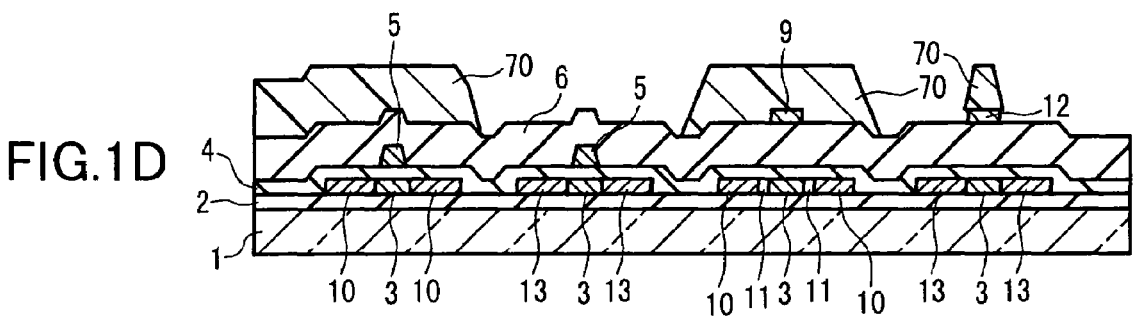

Then, a resist pattern 70 is formed. By a photolithographic operation with a F(fluorine)-based gas, the second gate layer 7 of MoW is dry-etched to form the gates 12 of P-type TFTs as shown in FIG. 1D.

B (boron), a P-type impurity, is implanted into the semiconductor layer through the first gate insulation film 4 and second gate insulation film 6 by utilizing the resist pattern 70 and first gate layer 5 as a mask. This forms the source and drain 13 of each P-type TFT. The acceleration voltage is 30 kV and the dose is $10^{15}/cm^2$. During this implantation, N-type TFTs are protected by the resist pattern 70 in order to prevent B from implanting into them and deteriorating their characteristics.

After removing the resist film, activation is made by RTA (Rapid Thermal Anneal) or 600° C. or lower furnace anneal.

Figure 1E:
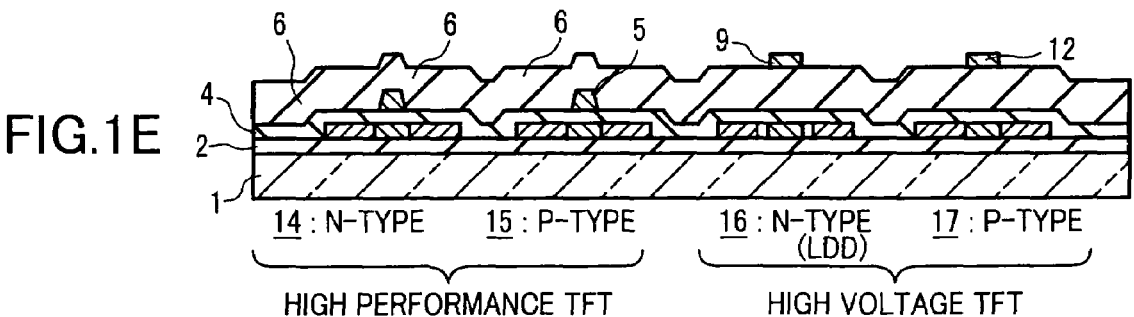

By the production steps mentioned so far, the following types of transistors are formed on the same substrate as shown in FIG. 1E.

(1) N-channel type thin film transistor 14 comprising a first gate insulation film 4 and a first gate layer 5 and having no LDD.
(2) P-channel type thin film transistor 15 comprising a first gate insulation film 4 and a first gate layer 5 and having no LDD.
(3) N-channel type thin film transistor 16 comprising a first gate insulation film 4, a second gate insulation film 6, a gate electrode 9 made from the second gate layer, and LDD 11 formed in a self-aligned manner below the gate edge.
(4) P-channel type thin film transistor 17 comprising a first gate insulation film 4, a second gate insulation film 6 and a gate electrode 12 made from the second gate layer, and having no LDD 11 below the gate edge.

The N-type transistor 14 and P-type transistor 15 are high performance TFTs while the N-type transistor 16 and P-type transistor 17 are high voltage TFTs.

In this example, not only the source and drain of a thin film transistor whose gate is made from the first gate layer 5 but also the source and drain of a thin film transistor whose gate is made from the second gate layer 7 are formed at the same time by a production step during which an impurity is implanted into the semiconductor film through the first gate insulation film 4 and second gate insulation film 6. Therefore, it is possible to form thin film transistors differing in the thickness of the gate insulation film without increasing the number of ion implantation steps. In addition, this method does not increase the number of photolithographic processes except the mask used to process the first gate layer. That is, this method is superior in productivity since a plurality of thin film transistors having different characteristics can be formed by a fewer number of production steps. Further, in this example, not only a high voltage thin film transistor having a self-aligned LDD but also a high performance thin film transistor having no LDD can be formed at the same time by an impurity implantation step where the resist pattern 8 used to process the second gate layer, a gate made from the first gate layer 5 are used as a mask.

This embodiment is summarized as follows: A manufacturing method of a thin film transistor substrate in which, on a substrate, a crystalline semiconductor film, a first gate insulation film, a first gate layer, a second gate insulation film and a second gate layer are deposited sequentially and first thin film transistors each of which comprises the first gate insulation film and a gate made from the first gate layer and second thin film transistors each of which comprises the first and second gate insulation films and a gate made from the second gate layer and does not comprise the first gate layer are formed, is characterized by including the step of implanting a dopant into the semiconductor layer through the first and second gate insulation films by utilizing a resist pattern used to process the second gate layer and the patterned first gate layer both as a mask.

Further, a manufacturing method of a thin film transistor substrate manufacture method in which, on a substrate, a crystalline semiconductor film, a first gate insulation film, a first gate layer, a second gate insulation film and a second gate layer are deposited sequentially and first thin film transistors each of which comprises the first gate insulation film and a gate made from the first gate layer and second thin film transistors each of which comprises the first and second gate insulation films and a gate made from the second gate layer and does not comprise the first gate layer are formed, is characterized by including a step of processing the second gate layer so as to form a gate narrower than the corresponding resist pattern, a first implantation step of implanting a N type dopant into the semiconductor film by utilizing the resist pattern used to process the second gate layer and the patterned first gate layer both as a mask and a second implantation step of, after removing the resist pattern, implanting a N type dopant into the semiconductor layer at a lower dose than in the first implantation step through the first and second insulation films by utilizing the patterned first and second gate layers as a mask.

Figure 2A:
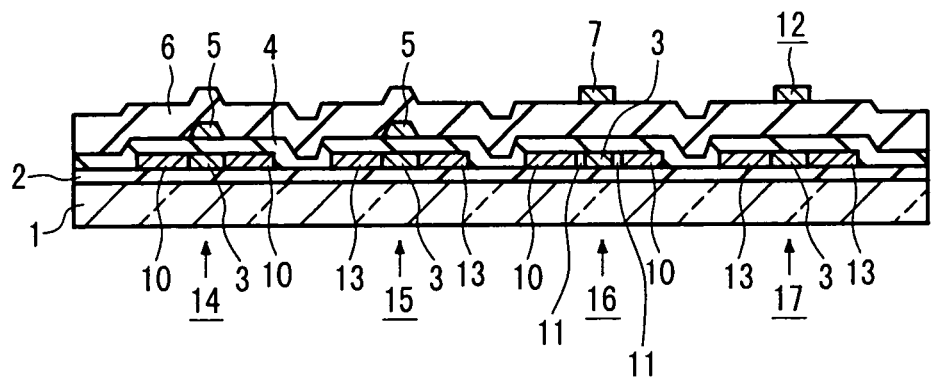
FIGS. 2A to 2C are sectional views, showing a part of an example of a manufacturing flow to fabricate a thin film transistor substrate according to the present invention.
Figure 2B:
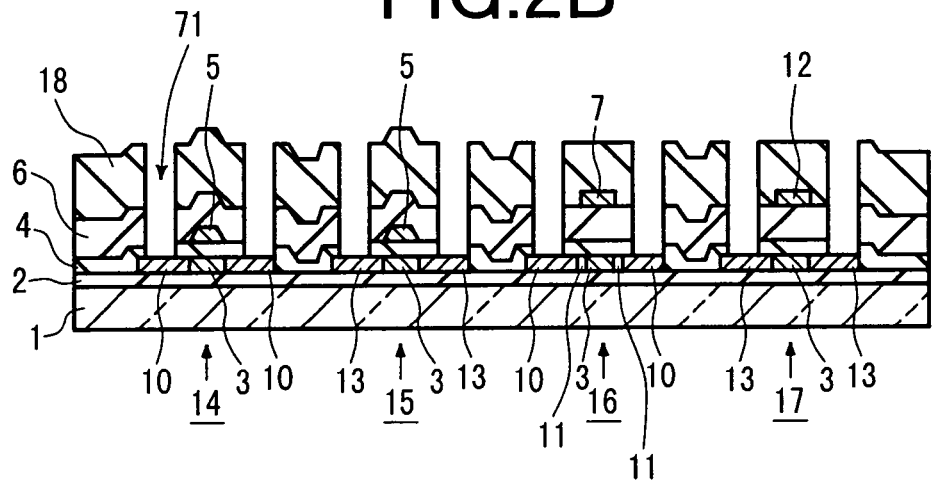

With reference to the sectional views in FIGS. 2 and 3, the following will provides a general description of how a substrate on which various TFTs are fabricated as mentioned so far is used as a thin film transistor substrate in a transparent type liquid crystal display unit.

On the substrate (FIG. 2A) which has gone through the production steps described so far, a 500 nm-thick interlayer insulation $SiO_2$ film 18 is formed by CVD. Then, contact holes 71 are bored through the interlayer insulation film 18, second gate insulation film 6 and first gate insulation film 4 by a common photolithographic operation including hydrofluoric acid-used wet etching (FIG. 2B. As shown in this example, according to the present invention, the sources and drains 10 of thin film transistors (14, 15, 16 and 17) differing in the gate insulator thickness are all covered by the same film structure consisting of 4, 6 and 18. Therefore, contact holes can be bored by the same etching operation without increasing the number of production steps. Note that the transistors 14 and 15 have the insulation film 4 as their gate insulation film while the transistors 16 and 17 have the insulation films 4 and 6 as their gate insulation film.

Figure 2C:
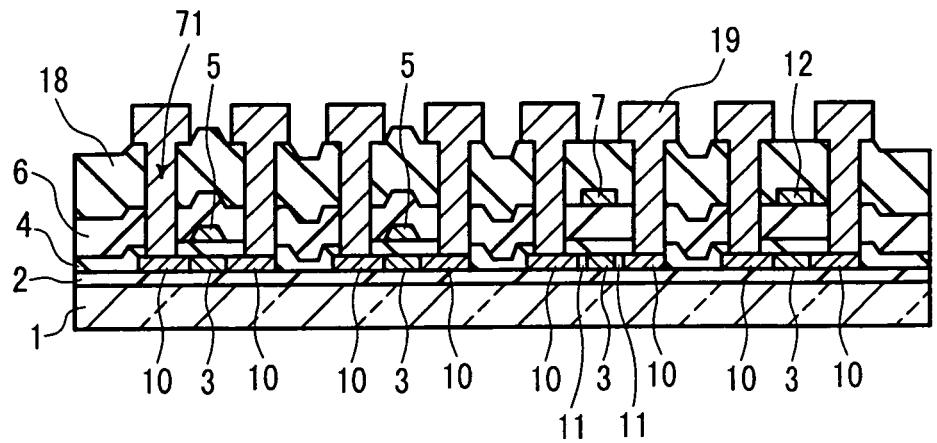

Then, Ti, AlSi and Ti are deposited sequentially by sputtering to form a layered wiring film 19. By a photolithographic operation, the layered film 19 is patterned for wiring. This layered conductor film 19 is connected with the semiconductor layer 3. Note that at this time, connection with the first gate layer 5 and second gate layer 6 is also done simultaneously. The top and bottom Ti layer of this layered conductor film 19 have a thickness of 100 nm each while the thickness of the middle AlSi layer is 500 nm. The resulting profile is shown in FIG. 2C.

Figure 3A:
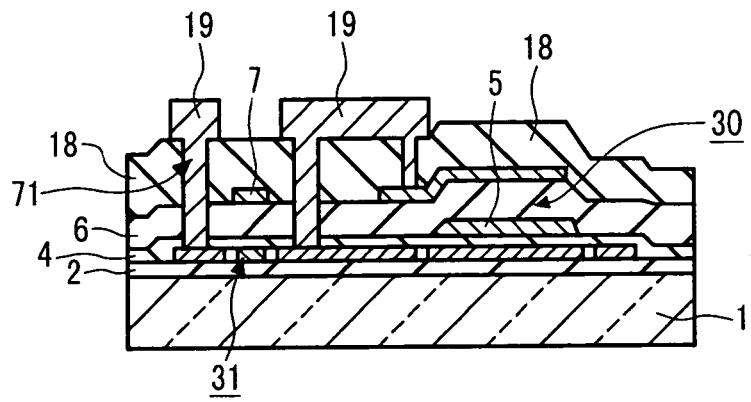
FIGS. 3A to 3C are sectional views of an example of a pixel of a thin film transistor substrate according to the present invention.
Figure 3B:
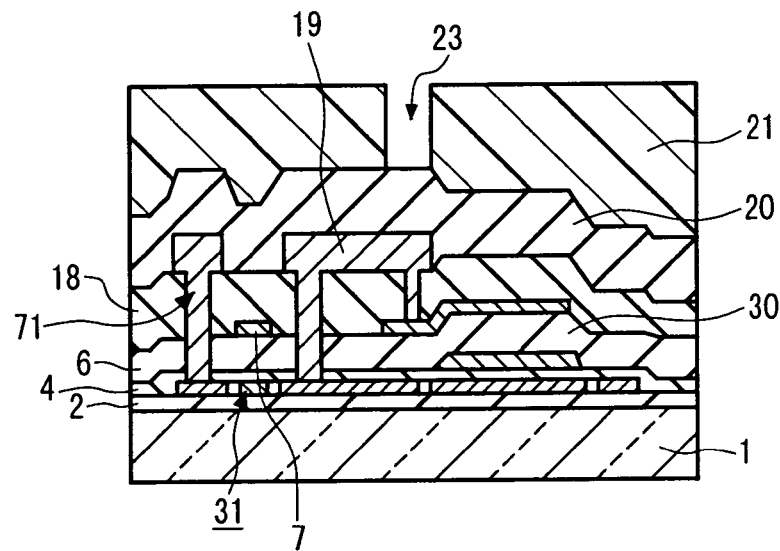
Figure 3C:
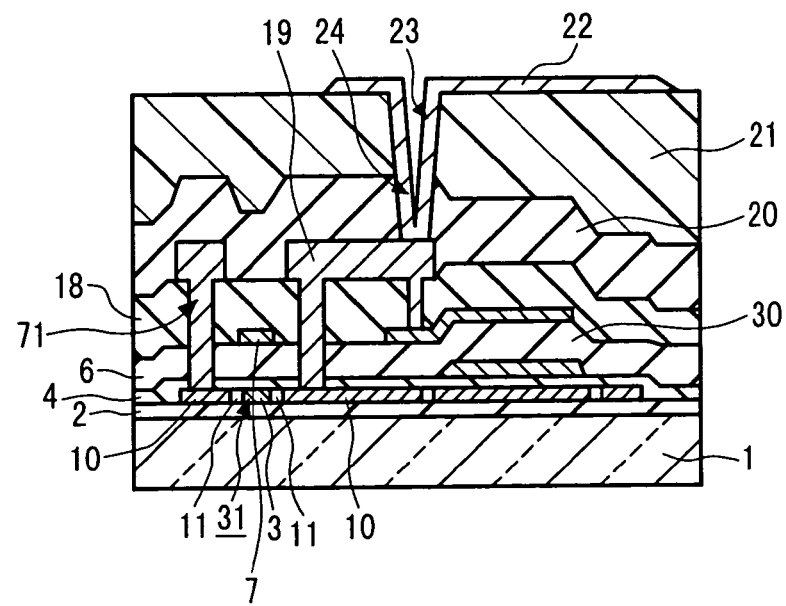

FIGS. 3A to 3C show each a sectional view of a neighborhood of a pixel of a display unit. Covered in FIG. 3 is a thin film transistor having LDD and its circumference. After a wiring pattern is formed on the substrate as described with FIG. 2C (FIG. 3A), a 400 nm-thick protective SiN film 20 is formed over the top of it by plasma CVD. Further, the TFT is hydrogenated by annealing it at 400° C. or lower in reducing atmosphere. Then, a photosensitive organic film is applied. After appropriate exposure, development and sintering, a 2 µm-thick organic protective film 21 is formed with an opening 23 (FIG. 3B).

Using this organic protective film 21 as a mask, the SiN protective film 20 is dry-etched to form an opening 24. This opening 24 leads to the Ti/AlSi/Ti-layered conductor film 19. A transparent conductor film of ITO (Indium-Tin-Oxide) is deposited by sputtering so as to reach a wiring layer 19 and patterned by a common photolithographic operation to form a pixel electrode 22. The resulting profile of the thin film transistor substrate is shown in FIG. 3C.

Further, in the production flow from FIGS. 1A to 3C, it is possible to form a capacitor 30 consisting of the semiconductor layer 3, first gate insulation film 4, first gate layer 5, second gate insulation film 6 and second gate layer 7 deposited sequentially.

FIG. 4 shows another method for manufacturing a thin film transistor substrate according to the present invention. In FIGS. 4A to 4E, parts like those shown in FIGS. 1A to 1E are denoted by the same reference numerals. Similar to the process flow in FIG. 1, a 100 nm-thick first gate insulation film 4 and a 150 nm-thick first gate layer of Mo are deposited on a 50 nm-thick polycrystalline Si film in this order. The first gate insulation film 4 is formed by plasma CVD with TEOS while the Mo layer is deposited by sputtering.

Figure 4A:
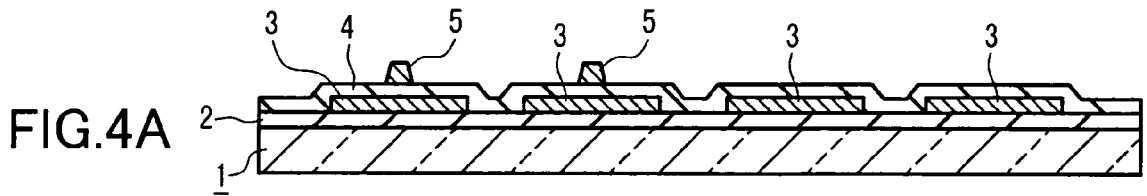
FIGS. 4A to 4E are sectional views, showing an example of a manufacturing flow to fabricate a thin film transistor substrate according to the present invention.

By a photolithographic operation including dry etching with a Cl-based gas, the Mo film is etched to form gates which are normally tapered as shown in FIG. 4A.

Figure 4B:
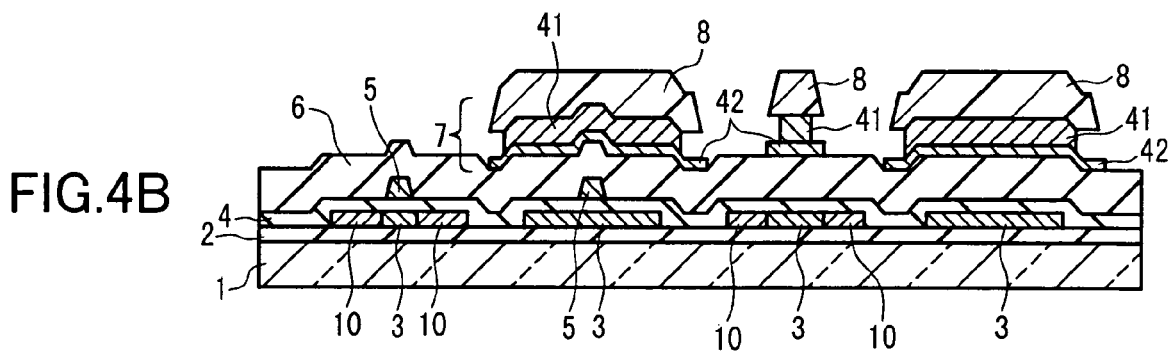
Figure 4C:
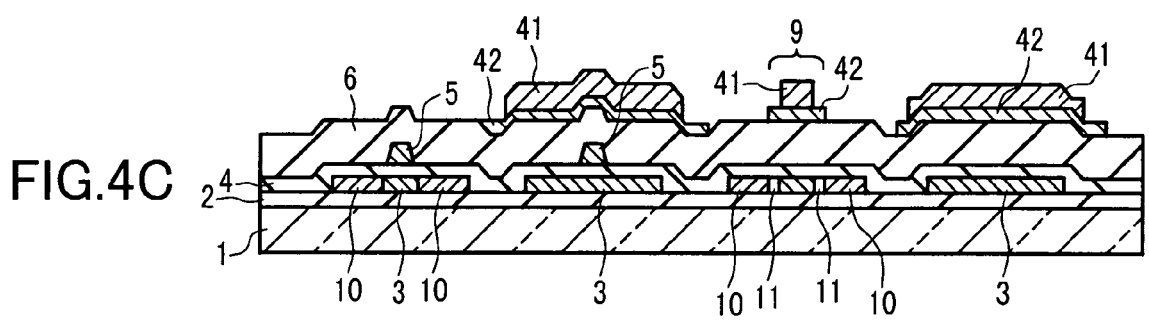

Then, as shown in FIG. 4B, a 50 nm-thick CVD oxide film is formed as a second gate insulation film 6 and a two-layered film consisting of a 30 nm-thick Ti layer 42 and a 150 nm-thick MoW alloy layer 41 is formed on the second gate insulation film 6. This layered conductor film is a second gate layer 7 from which gates 9 will be made. A photo resist 8 is applied onto this film and processed into a desired pattern. Then the MoW alloy layer 41 of the second gate layer is wet-etched with a mixture of phosphoric acid, nitric acid, acetic acid and water in such a manner that the width of the MoW alloy layer 41 in the channel direction is made about 0.5 µm narrower at each side than the corresponding width of the resist pattern 8. Then, the Ti layer 42 is dry-etched with a F-based gas so as to have almost the same dimensions as the resist pattern. The resulting profile is shown in FIG. 4B.

Using the resist pattern 8 and first gate layer 5, ions are implanted through the first gate insulation film 4 and second gate insulation film 6 to form the sources and drains 10 of N-type thin film transistors. P ions are implanted at a dose of $10^{15}$/cm$^2$ with an accelerating voltage of 80 keV. Note that the total thickness of the gate insulation film 4 and second gate insulation film 6 should be not larger than 150 nm. Beyond 150 nm, the resist film 8 is damaged by P ions accelerated enough to be implanted into the semiconductor layer 3 through the gate insulation films.

After removing the resist film 8, P ions are implanted with an acceleration voltage of 80 keV at a dose of $10^{14}$/cm$^2$ through the first gate insulation film 4 and second gate insulation film 6 by utilizing the MoW layer 41 of the second gate layer and the first gate layer 5 as a mask. By this ion implantation, LDD 11 is formed in the semiconductor layer 3 below each protruding part of the Ti layer 42 of the gate 9 so that a thin film transistor of a gate overlap structure is obtained. With this gate overlap structure, the thin film transistor not only shows the same performance as a thin film transistor having no LDD but also is much free of deterioration.

Figure 4D:
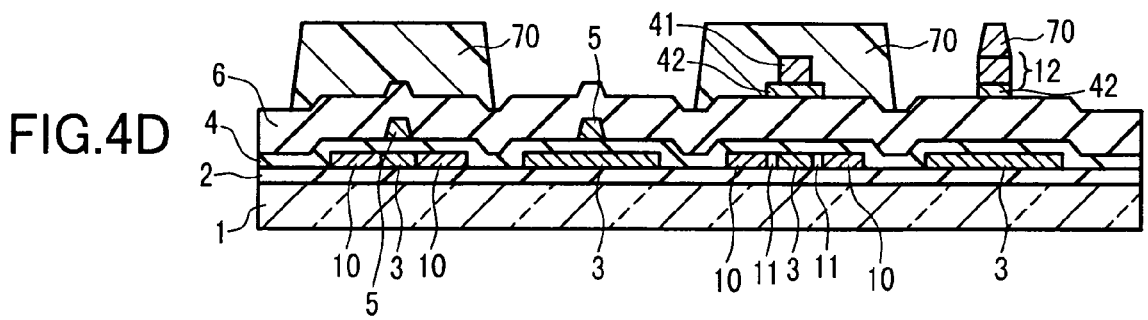
Figure 4E:
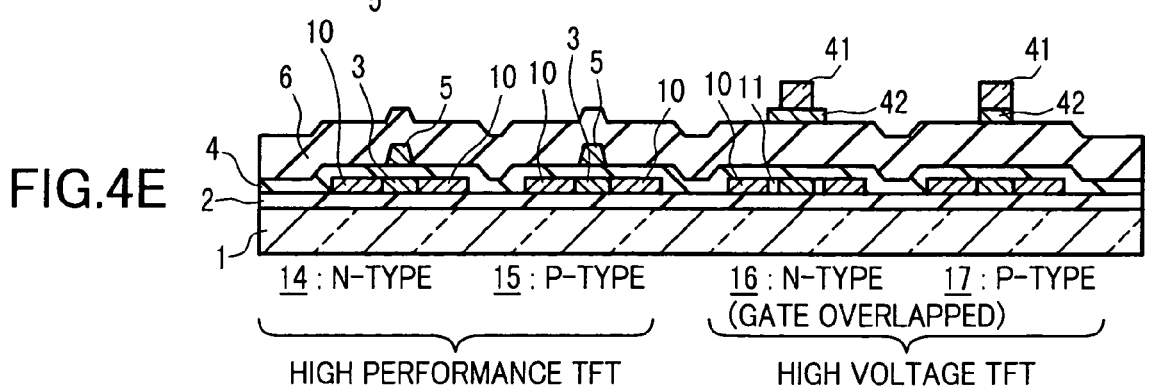

Then, similar to the production flow of FIG. 1, after a desired photo resist pattern 70 is formed on the top of the substrate, the gate 12 of a P-type TFT is formed by dry-etching as shown in FIG. 4D. Then, using the gate 5 and resist 70 as a mask, B ions are implanted to form P-type thin film transistors having different characteristics. The resulting profile of the thin film transistor substrate is shown in FIG. 4E.

The first gate layer may also be double-layered to form thin film transistors of the gate overlap structure with the first gate layer. In addition, after second layer gates are formed, the second gate insulation film may partly or wholly be etched by utilizing the gate or the resist used to shape the gate as a mask so as to reduce the film thickness. Thinning the gate insulation film makes it possible to lower the acceleration voltage needed to implant ions and thereby reduce the damage to the resist. This does not need to increase the number of ion implantation steps since thin film transistors whose gates are made from the first gate layer and those whose gates are made from the second gate layer will have their respective gate insulation layers of the same thickness above the semiconductor layer after the second gate insulation film is etched.

Figure 5:
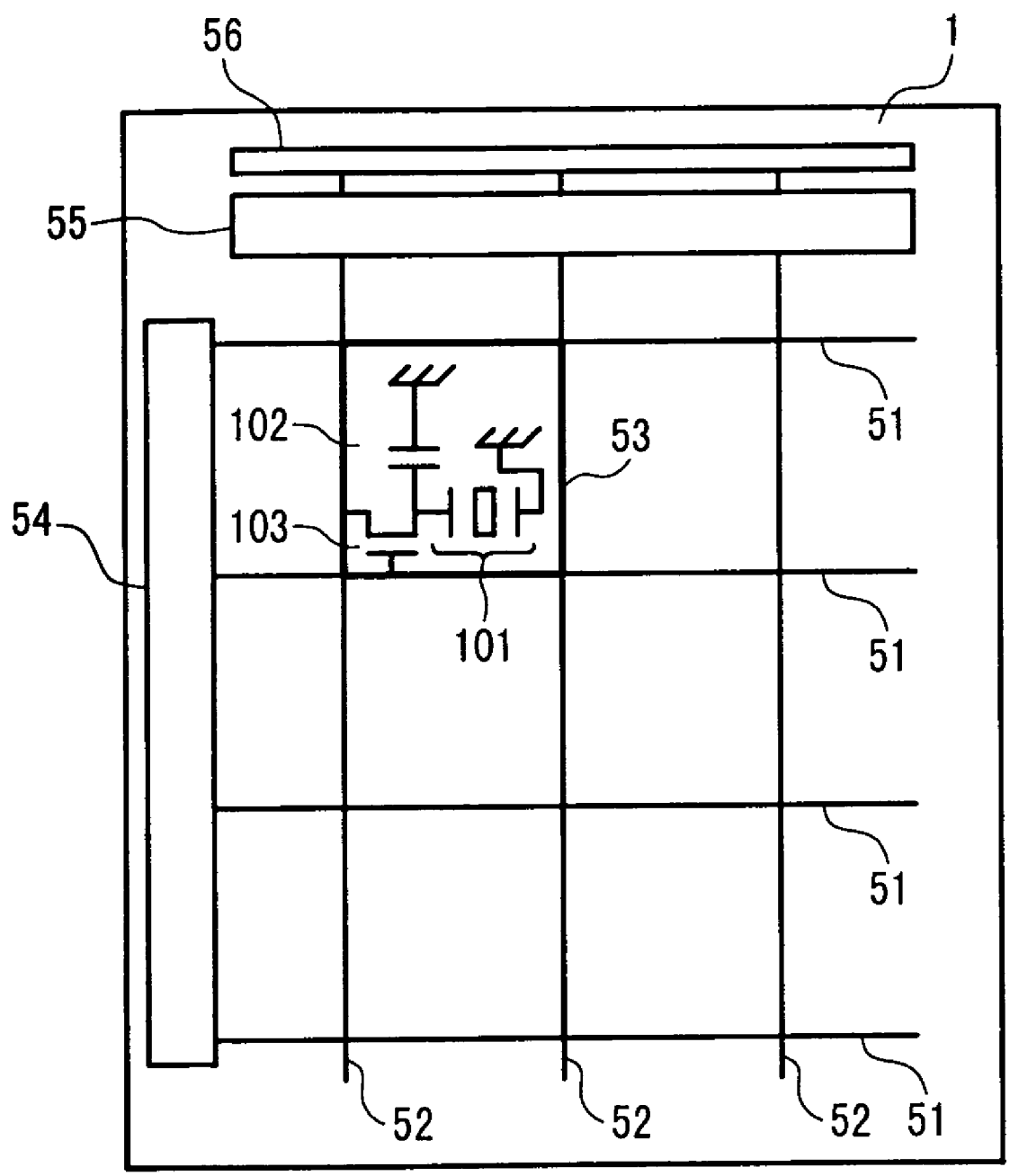
FIG. 5 shows an example of a driver-integrated type liquid crystal display unit according to the present invention.

Now the following describes an example of a thin film transistor substrate in a circuit-integrated type liquid crystal display unit. FIG. 5 is a schematic plan view of major components arranged in a thin film transistor substrate in a circuit-integrated type liquid crystal display unit.

On a transparent insulating substrate 1, a plurality of gate lines 51 and a plurality of data lines 52 are laid in such a manner that they intersect each other. A pixel 53 is formed beside each point of intersection of the gate lines 51 and data lines 52. As shown, the internal circuit of a pixel consists basically of a display component 101, a storage capacitor 102 and a switching device 103. Examples of these components will be described later in detail. Near the pixel array area, a gate driver 54 to drive the gate lines and a data line driver 55 to drive the data lines are formed. In addition, an interface circuit 56 is formed which converts an external signal into an image signal. The interface circuit 56 is driven at low voltage by high performance thin film transistors whose gates are made from the first gate layer. The drive voltage is, for example, 10 V or lower. On the other hand, the gate driver 54, data line driver 55 and pixels are formed using thin film transistors whose gates are made from the second gate layer since a relatively high voltage, for example, 15 V or higher, is required.

According to the present invention, as clarified by the description provided so far, drivers comprising low voltage drive and easy-fining thin film transistors and drivers/pixels comprising high voltage thin film transistors excellent in withstand voltage can be formed on the same substrate at low cost. Note that the present invention allows a similar driver configuration to be employed in such display units as an organic electroluminescence display unit as well as a liquid crystal display unit and facilitates the integration of low power consumption and space-saving drive circuitry therein.

Figure 6A:
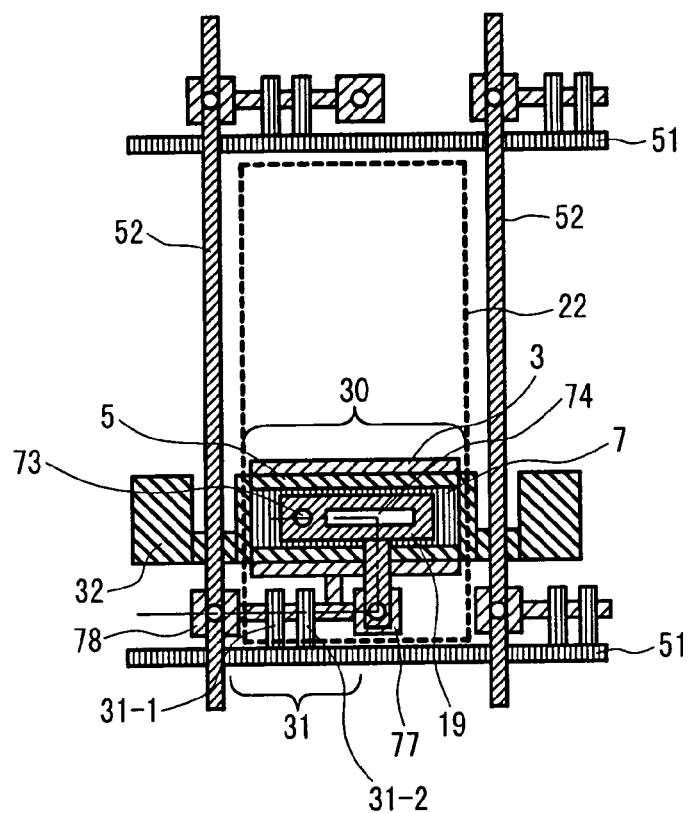
FIGS. 6A and 6B are a plan view and a cross sectional view, respectively, showing an example of a liquid crystal display unit according to the present invention.
Figure 6B:
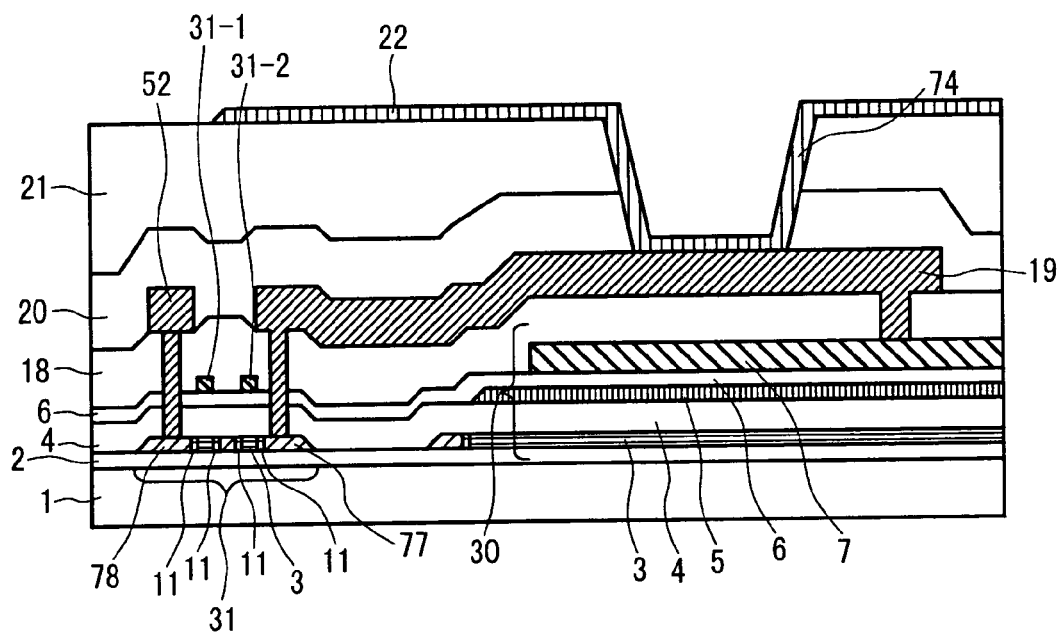

FIG. 6A is a top view of an example of a pixel in a liquid crystal display unit according to the present invention. FIG. 6B shows a cross sectional view of the pixel. Although in the liquid crystal display unit, there is provided an opposite substrate facing the thin film transistor substrate and liquid crystal is filled between them, only the thin film transistor substrate is shown in the figure. In a pixel enclosed by gate lines 51 and data lines 52, a pixel electrode 22 to apply voltage to liquid crystal is made of a transparent conductor film. In FIG. 6A, the pixel electrode 22 is depicted as an area enclosed by a dotted line. Liquid crystal is filled onto the pixel electrode 22. Via a through hole 74, the pixel electrode 22 is connected to wiring 19 which is formed from the same layer conductive film as the data lines 52. The wiring 19 is connected to the source 77 of a pixel switch 31, i.e., a high voltage thin film transistor which has gates 31-1 and 31-2, made from the second gate layer, and LDD 11 below the gate edges. Note that the pixel switch 31 is the so-called double-gate thin film transistor and its gates 31-1 and 31-2 are connected to a gate line 51. Such a double-gate type thin film transistor is more suitable for use as a pixel switch than single-gate type thin film transistors since the withstanding voltage can be raised and the off current can be reduced. To the drain 78 of the pixel switch 31, a data line 52 is connected. In addition, to the pixel electrode 22, a storage capacitor 30 to retain voltage is connected. As shown in the section of FIG. 6B, the storage capacitor 30 is composed of two capacitors connected in parallel; one capacitor consists of the first gate insulation film between the semiconductor layer 3 and the first gate layer 5 and the other capacitor consists of the second gate insulation film 6 between the first gate layer 5 and the second gate layer 7. The semiconductor layer 3 forming the lower electrode of the storage capacitor is an extension of the source of the pixel switch 31. The second gate layer 7 is also connected to the source of the pixel switch 31 via the wiring 19 and contact hole 73. Meanwhile, the first gate layer 5 forming an electrode of the storage capacitor is connected to a common line 32 in the same layer. Ten volts or higher voltage is always applied between the common line 32 and the semiconductor layer in order to prevent the semiconductor layer from being depleted. If the pixel switch is turned on by a voltage from the gate line, the voltage from the data line is applied to the pixel electrode 22 and the storage capacitor 30. If the pixel switch is turned off, the storage capacitor 30 retains the written voltage applied to the pixel electrode 22. To prevent the voltage of the pixel electrode from changing substantially, the size of the storage capacitor is determined to make a fluctuation in voltage due to the off current of the pixel switch negligible.

Figure 7A:
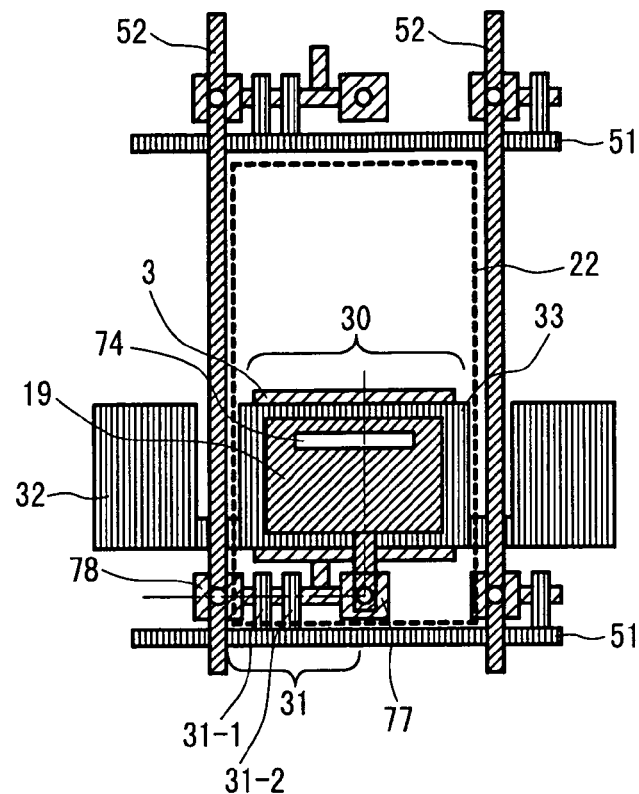
FIGS. 7A and 7B are a plan view and a cross sectional view, respectively, showing an example of a pixel of a conventional liquid crystal display unit.
Figure 7B:
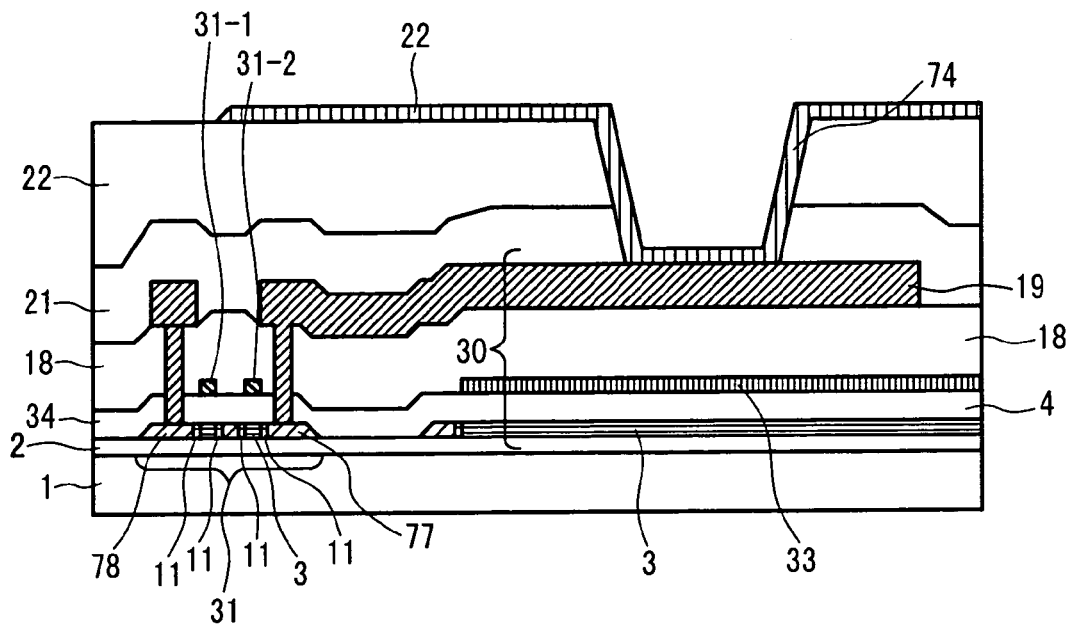

For the purpose of comparison, FIGS. 7A and 7B show an example of a pixel in a conventional liquid crystal display unit. Similar to the example in FIG. 6, only the thin film transistor substrate is shown. A transparent pixel electrode 22 is connected to a storage capacitor 30. The storage capacitor 30 has a function to retain the voltage applied to the pixel electrode. As shown in FIG. 7B, the storage capacitor 30 consists of two capacitors connected in parallel; one is the gate insulation film 34 between the semiconductor layer 3 and the gate layer 33 while the other is the interlayer insulation film 18 between the gate layer 33 and the wiring 19. Since the interlayer insulation film is thick, however, the storage capacitor 30 is composed mainly of the capacitor between the semiconductor layer 3 and the gate layer 33. The gate layer 33 forming an electrode of the storage capacitor is connected to the common line 32 which is made from the gate layer 33. In addition, the wiring 19, which is a patterned conductive film in the same layer as the data lines, forms another electrode of the storage capacitor and is connected to the pixel electrode via the through hole 74 and also to the source 77 of the pixel switch 31, i.e., a double-gate type thin film transistor 31 having LDD 11. The source 77 is extended and connected to the semiconductor layer 3 forming the lower electrode of the storage capacity. The gates 31-1 and 31-2 of the pixel switch 31 or a thin film transistor are conductors formed by patterning the gate layer 33 and connected to the gate line 51 formed also by patterning the gate layer 33. Similar to thin film transistors forming a peripheral circuit, the gate insulation layer 34 of the thin film transistor 31 serving as a pixel switch is a relatively thin single layer. Therefore, since the thin film transistor 31 exhibits a large off current, the storage capacitor must have a large area. In the example, the storage capacitor occupies about 30% of the pixel area. On the other hand, in the case of the example of FIG. 6 according to the present invention, the thin second gate insulation film between the first gate layer and the second gate layer is utilized in addition to the capacitance between the semiconductor layer 3 and the first gate layer, the capacitor 30 has larger capacitance per area. Therefore, the area required to form the storage capacitor 30 can be reduced, resulting in a higher aperture ratio. In the example of FIG. 6, the storage capacitor can have almost twice the capacitance per area of the conventional storage capacitor. Accordingly, the area occupied by the storage capacitor is reduced about by half, resulting in an about 10% increased aperture ratio.

Figure 8:
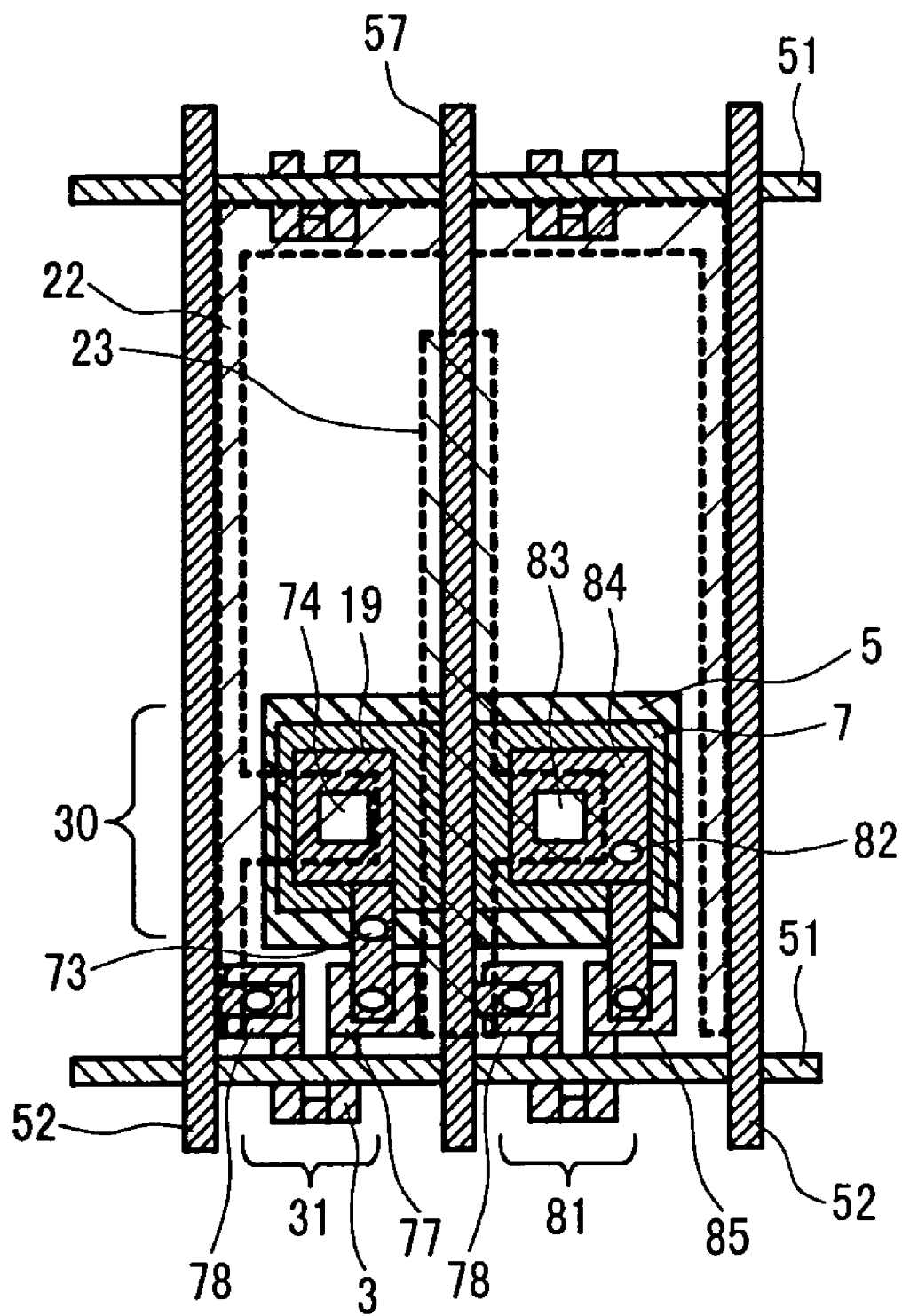
FIG. 8 is a plan view showing an example of a pixel of an in-plane switching type liquid crystal display unit according to the present invention.
Figure 9:
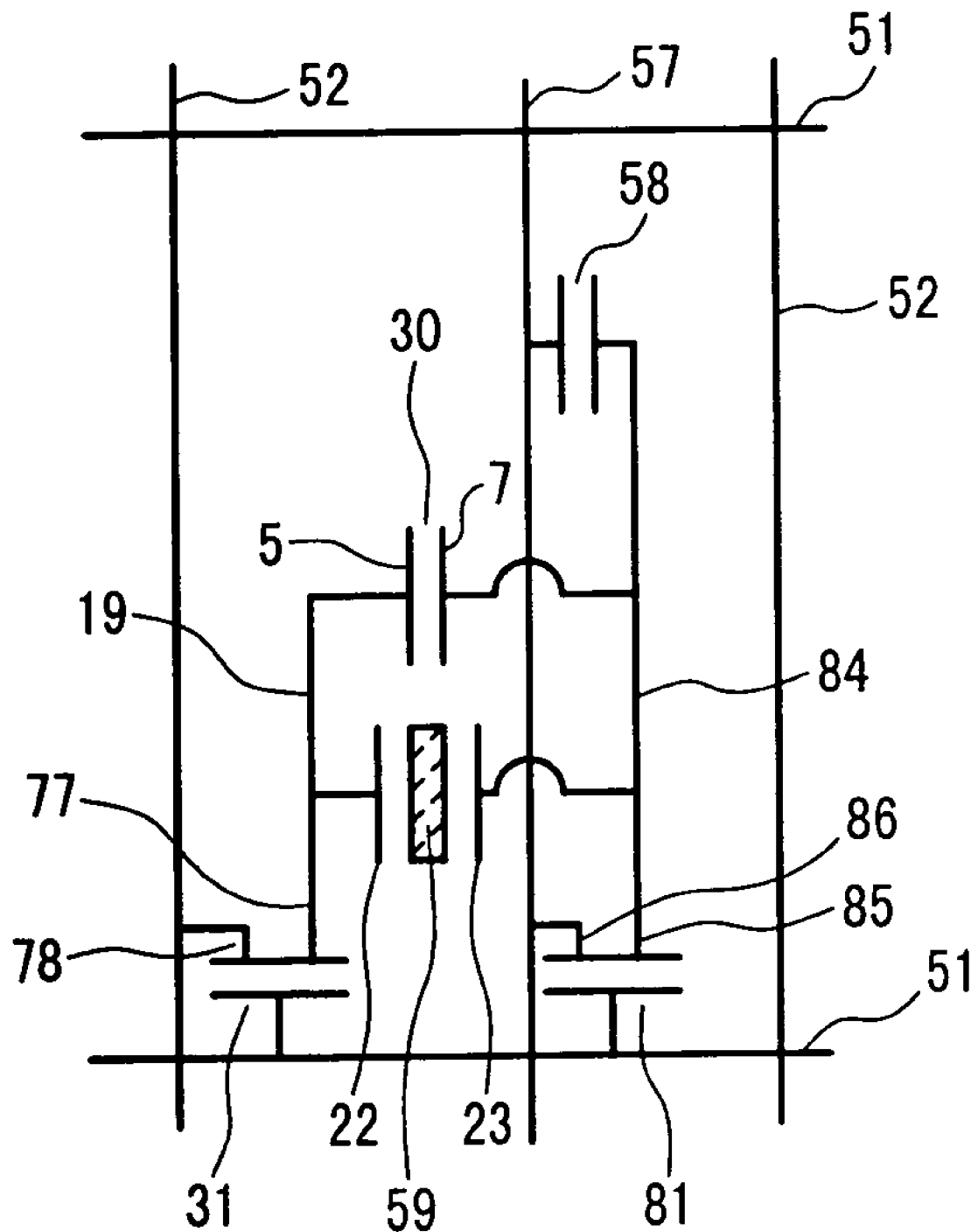
FIG. 9 is a circuit diagram of an example of a pixel of an in-plane switching type liquid crystal display unit according to the present invention.
Figure 10:
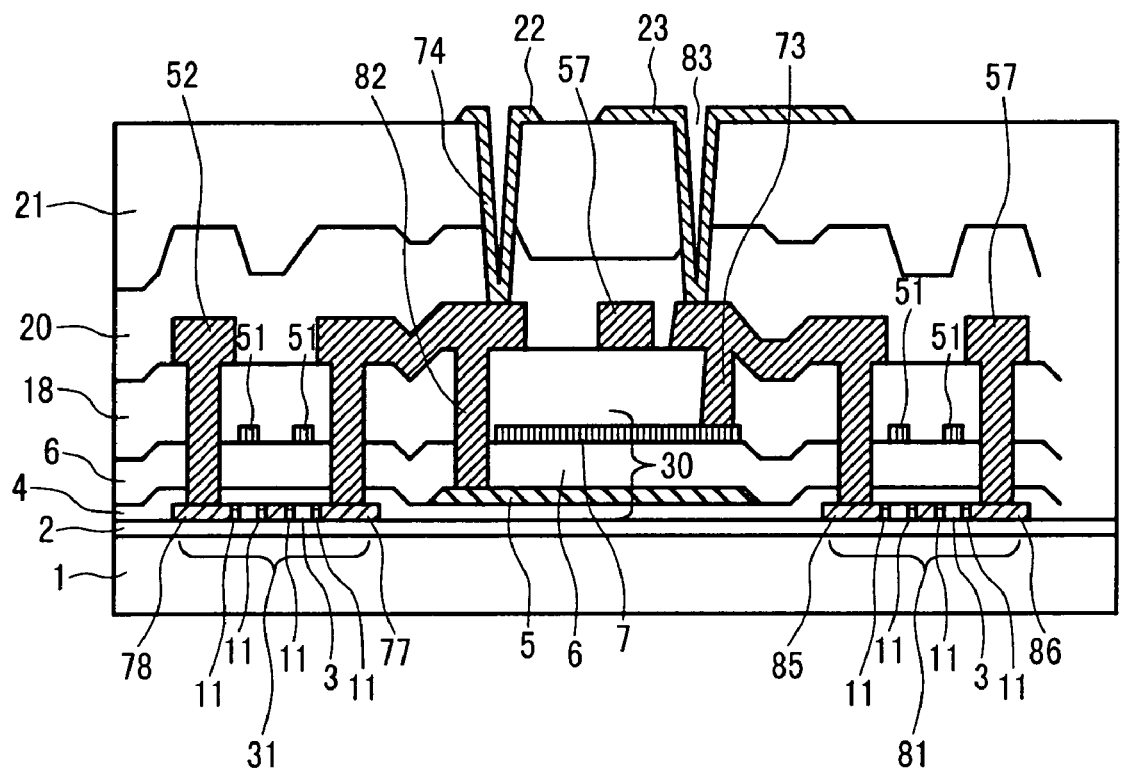
FIG. 10 is a cross sectional view showing an example of a pixel of an in-plane switching type liquid crystal display unit according to the present invention.

FIGS. 8, 9 and 10 respectively show the top view, circuit diagram and sectional view of a pixel in an in-plane switching type liquid crystal display unit according to the present invention. In this example, it is important how an insulation film constituting a transistor of the electronic circuit in the pixel is used to form a storage capacitor 30. The following description is directed to this point at first.

Referring to the sectional view of FIG. 10 shows, the storage capacitor 30 is formed by an insulation layer extending from the second gate insulation film 6 between a conductive layer extending from the first gate layer 5 and a conductive layer extending from the second gate layer. The storage capacitor 30 is connected between a pixel electrode 22 and a common electrode 23 both made of ITO and serves to keep the potential difference between these electrodes. In in-plane switching type liquid crystal display units, the drive voltage is relatively high. Accordingly, the gate insulation film in each pixel switch or thin film transistor in this example is designed to have a relatively large thickness of 120 nm or larger. According to the present invention, however, it is also possible to easily form a low power consumption peripheral drive circuit by thinning the insulation film there to 100 nm or less.

FIG. 9 shows an equivalent circuit of the pixel. An electric field between the pixel electrode 22 and the common electrode 23 drives liquid crystal 59. The storage capacitor 30 formed between the first gate layer and the second gate layer is connected between the pixel electrode 22 and the common electrode 23 according to the present invention in order to retain the voltage applied to the liquid crystal. The pixel electrode 22 and the common electrode 23 are respectively connected to the pixel switches 31 and 81. The pixel switches 31 and 81, if turned on by a voltage of the gate line 51, connect the data line 52 to the pixel electrode 22 and the common electrode line 57 to the common electrode 23 respectively and, when the voltage is written to the storage capacitor 30, are turned off. The applied voltage retained by the storage capacitor is reversed periodically in polarity in order to prevent deterioration of the liquid crystal. If the capacitor uses the semiconductor layer as an electrode as conventionally, the configuration shown in FIG. 9 is inappropriate since the semiconductor layer is depleted depending on the polarity of the voltage, which changes the capacitance. According to the present invention, it is possible to obtain sufficient capacitance without using a semiconductor film and therefore advantageously increase the aperture ratio since use of the configuration of FIG. 9 can omit another line parallel to the gate line, which has been required for capacitance conventionally.

Further, as shown in the top view of FIG. 8, the common electrode can be arranged to overlap with the common electrode line, which increases the aperture ratio. Note that this overlapping causes a parasitic capacitance 58 as shown in FIG. 9. Although this capacitor changes the voltage of the common electrode according to the voltage of the common electrode signal line, however, display does not change since the voltage applied to the liquid crystal 59 is kept by the storage capacitor 30.

Also in the in-plane switching type liquid crystal display unit, there is provided an opposite substrate facing the thin film transistor substrate and liquid crystal is filled between them. In the figures, however, only the thin film transistor substrate is shown. Areas 22 and 23 enclosed by dotted lines in FIG. 8 respectively represent the pixel electrode and common electrode both made of transparent ITO. Via the through hole 74, the pixel electrode 22 is connected to the conductive wiring 19 formed in the same layer as the data lines 52. The wiring 19 is connected by way of a contact hole 73 to the first gate layer 5 serving as the underlying electrode of the storage capacitor. The wiring 19 is also connected to the source 77 of a thin film transistor serving as the first pixel switch 31. Meanwhile, the common electrode 23 is connected by way of the through hole 84 to the conductive wiring 84 formed in the same layer as the data lines. The wiring 84 is connected by way of the contact hole 82 to the second gate layer 7 forming the upper electrode of the storage capacitor 30 and to the source 85 of a thin film transistor serving as the second pixel switch 81. The pixel switch 31 is the so-called double-gate type thin film transistor and its two gates are formed above the semiconductor layer 3 between the source 77 and drain 78 by the gate line 51 patterned so as to go across the semiconductor layer 3 twice.

The thin film transistor 31 is a high voltage thin film transistor having a LDD 11 below each side of the gates formed by using the gate line 51. Likewise, the thin film transistor 81 is a double-gate type thin film transistor having LDD.

Figure 11:
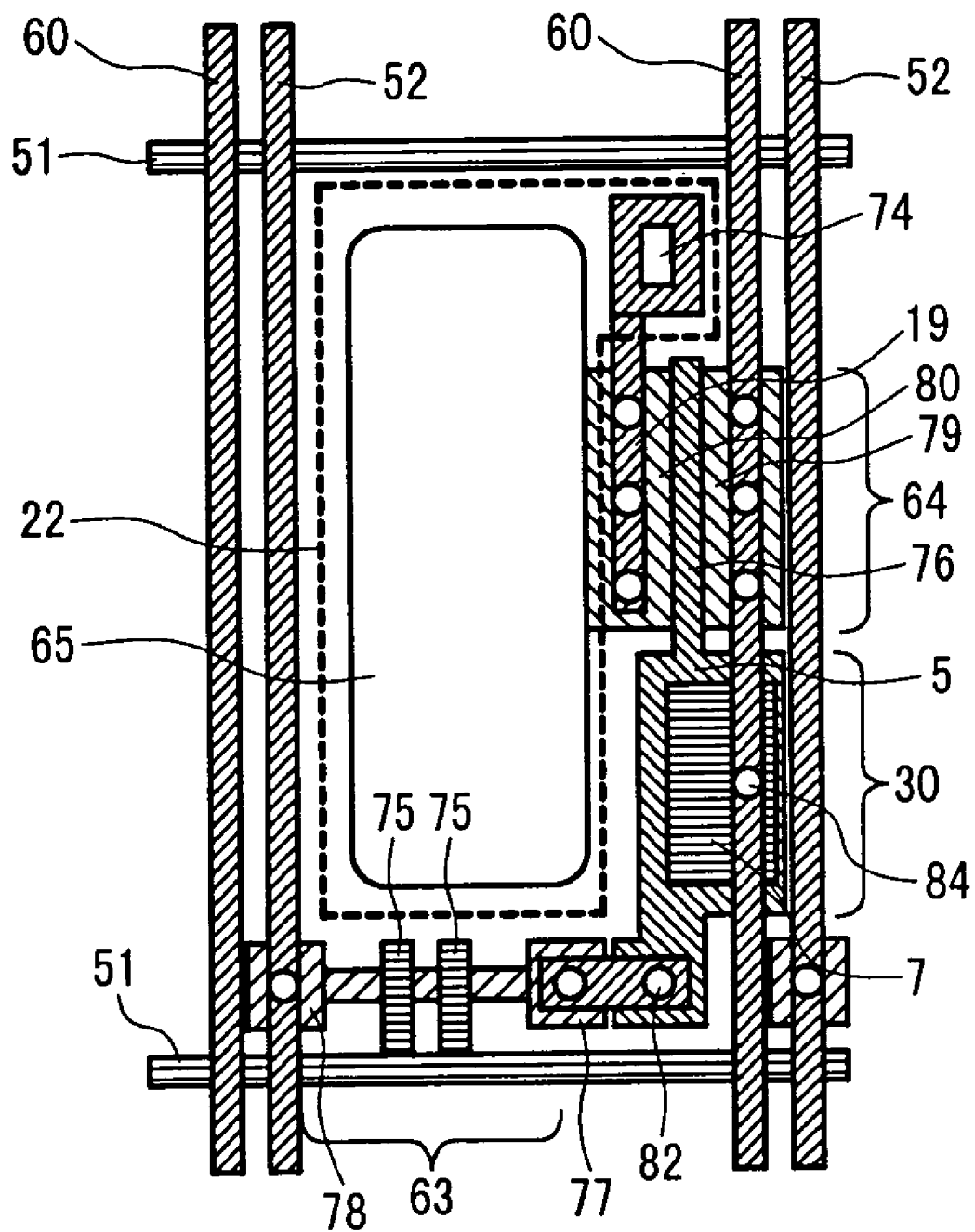
FIG. 11 is a top view showing an example of a pixel of an organic electroluminescence display unit according to the present invention.
Figure 12:
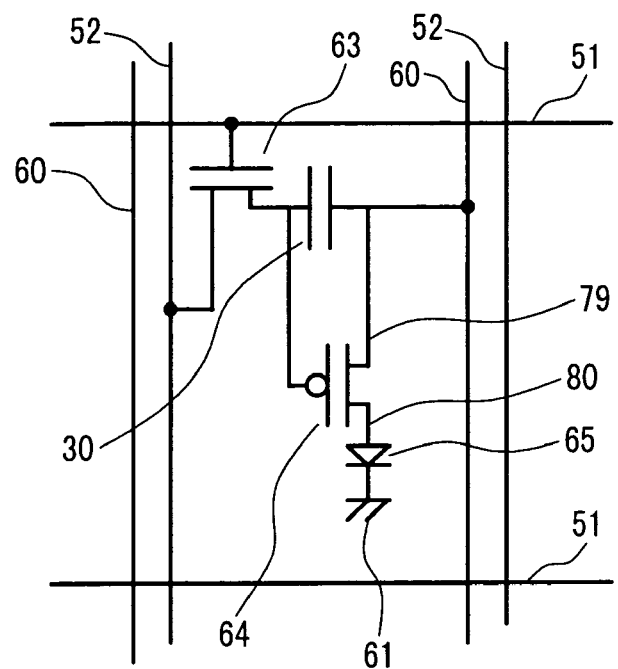
FIG. 12 is a circuit diagram of an example of a pixel of an organic electroluminescence display unit according to the present invention.
Figure 13:
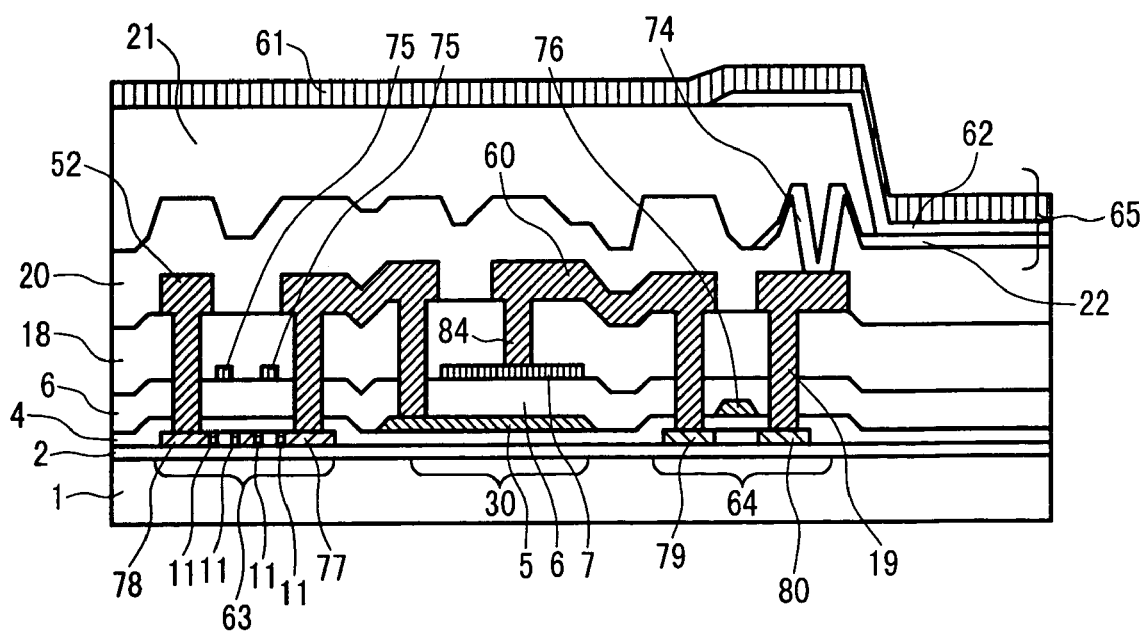
FIG. 13 is a cross sectional view of an example of a pixel of an organic electroluminescence display unit according to the present invention.

FIGS. 11, 12 and 13 respectively show the top view, circuit diagram and sectional view of a pixel in an organic electroluminescence display unit according to the present invention.

A plurality of data lines and a plurality of source lines 60 are laid in parallel. A plurality of gate lines 51 are laid so as to intersect them. Beside each point of intersection, a pixel is formed. In a pixel, thin film transistors 63 and 64 are formed. The gate, source and drain of the thin film transistor 63 are respectively connected to the gate line 51, data line 52 and storage capacitor 30. The thin film transistor 64 is connected to a pixel electrode 22 made of a transparent conductor such as IZO (Indium-Zinc-Oxide). In the aperture of the organic protective film 21, a hole transport layer, a light-emitting layer and an electron transport layer are vapor-deposited on the pixel electrode through a mask so that each pixel has a different light emitting spectrum of wavelength. Then, an organic electroluminescence element 65 is completed by vapor-depositing a common electrode 61 of Al so as to cover the whole surface. To the gate of the thin film transistor connected to the pixel electrode, the storage capacitor 30 to retain the gate voltage is connected.

In FIG. 11, the pixel electrode 22 serving as the lower electrode of the organic electroluminescence element 65 is depicted as an area enclosed by a dotted line. Via the through hole 74, the pixel electrode 22 is connected to the conductive wiring 19 formed in the same layer as the data lines. The wiring 19 connects the pixel electrode 22 to the drain 80 of the high performance P-type thin film transistor 64 having no LDD. The source of the thin film transistor 64 is connected to the source line 60 formed in the same layer as the data lines. The gate 76 of the thin film transistor 64 is extended to the first gate layer 5 forming the lower electrode of the storage capacitor 30 and further to the source 77 of the N-type thin film transistor 63. Meanwhile, a conductive film 7 which is formed in the same layer as the second gate layer and serves as the upper electrode of the storage capacitor 30 is connected to the source line 60. The thin film transistor 63 is a high voltage double-gate type thin film transistor having LDD 11 below the edges of gates 75 formed from the second gate layer. The gates 75 are connected to the conductive gate line 51 formed in the same layer. The drain 77 of the thin film transistor 63 is connected to the data line 52. When the thin film transistor 63 is turned on by a voltage on the gate line 51, a voltage applied from the data line 52 is written to the storage capacitor 30. When the thin film transistor 63 is turned off, the storage capacitor 30 retains the written voltage. The retained voltage is applied to the gate of the thin film transistor 64 in order to control the current flowing through the pixel electrode 22 to the organic luminescence element 65 so that the amount of light emission is kept at a desired level. Thus, the storage capacitor 30 has a function to retain the signal which controls the amount of light emission from the pixel.

The thin film transistor 64 connected to the pixel electrode is a low-threshold P-type thin film transistor whose gate is formed from the first gate layer deposited on the semiconductor layer via the first gate insulation film. The thin film transistor 63 whose source or drain is connected to the storage capacitor is a low off current N-type thin film transistor having gates formed from the second gate layer deposited on the semiconductor layer via the first and second gate insulation films and LDD formed below the gate edges. Since a thin gate insulation film is used in each thin film transistor driving the organic electroluminescence element, pixel-to-pixel threshold variation is low, resulting in small pixel to pixel display variation. The storage capacitor consists of the second gate insulation film between the first gate layer and the second gate layer. Since the second gate insulation film has a large capacitance per area, it is possible to raise the aperture ratio by reducing the area occupied by the storage capacitor. Raising the aperture ratio makes it possible to reduce the density of current which must be injected into the organic electroluminescence element for the same luminance. This advantageously results in suppressed deterioration and raised light emitting efficiency of the EL element. In addition, no electrode of the storage capacitor uses the semiconductor film which depletes where the voltage to the thin film transistor is around at its threshold level, resulting in lowering the response speed and changing the capacitance. This allows more accurate voltage control and raised image quality. Note that using the capacitance between two gate layers including no semiconductor film according to the present invention is also effective to a pixel where a compensation circuit is formed to suppress pixel-to-pixel variations in the current of the driving thin film transistor. The capacitor to retain the gate voltage of the driving thin film transistor can be formed in this manner, which improves the aperture ratio and voltage controllability, resulting in a higher image quality and longer service life display element.

As described so far with reference to the various embodiments, the present invention allows high productivity manufacturing of high image quality liquid crystal and organic electroluminescence display units having low power consumption and space saving drive circuits integrated therein.

According to a first embodiment of the present invention, it is possible to provide a simple manufacturing method for forming both LDD structure-included high voltage thin film transistors, suitable for driving liquid crystal or the like, and low voltage drive high performance thin film transistors on the same substrate.

According to another embodiment of the present invention, it is possible to provide a high aperture ratio and low power consumption display unit of the circuit-integrated type by fabricating the drive circuit from a polycrystalline Si film and reducing the capacitor area.

To facilitate understanding of the drawings, the major reference numerals are described below:

1: Glass Substrate, 2: Undercoat, 3: Semiconductor Layer, 4: First Gate Insulation Film, 5: First Gate layer, 6: Second Gate Insulation Film, 7. Second Gate Layer, 8: Resist, 9: Gate, 10: Source or Drain, 11: LDD, 12: Gate, 13: Source or Drain, 14: TFT, 15: TFT, 16: TFT, 17: TFT, 18: Interlayer Insulation Film, 19: Wiring, 20: SiN Protective Film, 21: Organic Protective Film, 22: Pixel Electrode, 23: Opening, 24, Opening, 30: storage Capacitor, 31. Pixel Switch, 32: Common Line, 33: Gate Layer, 34: Gate Insulation Film, 41: MoW Film, 42: Ti Layer, , 51: Gate line, 52: Data line, 53: Pixel, 54: Gate driver, 55: Data line driver, 56: Interface Circuit, 57: Common electrode Line, 58. Parasitic Capacitance, 59: Liquid Crystal, 60: Source Line, 61: Common electrode, 62: Organic Conductive Film/Light Emitting Layer, 65: Organic Electroluminescence Element, 70: Photoresist, 71: Contact Hole, 73: Contact Hole, 74: Through Hole, 75: Gate, 76: Gate, 77: Source, 78: Drain, 79: Source, 80: Drain, 82: Contact Hole, 83. Through Hole, 84: Wiring, 85: Source, 86: Drain, 101: Display Component, 102: Storage Capacitor, 103: Switching Device.

What is claimed is:

1. A thin film transistor substrate comprising:
   on an insulating substrate,
   plural first wiring lines and plural second wiring lines which intersect each other,
   plural pixels formed beside each point of intersection of said first and second wiring lines,
   capacitors to retain a signal,
   pixel switching devices,
   at least part of a driver circuit to drive a device, wherein
   said pixel switching devices comprise a first transistor including a gate insulation film containing a multi-layer of a first insulating film and a second insulating film,
   said driver circuit comprises a second transistor including a gate insulation film containing the first insulating film but not the second insulating film, the gate insulation film of the second transistor being thinner than the gate insulation film of the first transistor, and
   each said capacitor is to retain a signal is formed with the second insulating film extended from the gate insulation film of the first transistor.

2. A thin film transistor substrate according to claim 1, wherein said insulating substrate is a transparent insulating substrate.

3. A thin film transistor substrate comprising:
   on an insulating substrate,
   plural first wiring lines and plural second wiring lines which intersect each other,
   plural pixels formed beside each point of intersection of said first and second wiring lines,
   capacitors to retain a signal,
   pixel switching devices,
   at least part of a driver circuit to drive a device, wherein
   said pixel switching devices comprise a first transistor including a gate insulation film containing a multi-layer of a first insulating film and a second insulating film,
   said driver circuit comprises a second transistor including a gate insulation film containing the first insulating film but not the second insulating film, the gate insulation film of the second transistor being thinner than the gate insulation film of the first transistor, and
   each said capacitor to retain a signal is formed with said second insulating film between a metallic film elongating from the gate layer of the first transistor and a metallic film elongating from the gate layer of the second transistor.

4. A thin film transistor substrate according to claim 3, wherein said insulating substrate is a transparent insulating substrate.

* * * * *